(12) United States Patent
Chae et al.

(10) Patent No.: US 7,297,988 B2
(45) Date of Patent: Nov. 20, 2007

(54) FLIP CHIP TYPE NITRIDE SEMICONDUCTOR LIGHT EMITTING DEVICE

(75) Inventors: Seung Wan Chae, Kyungki-do (KR); Suk Kil Yoon, Kyungki-do (KR); Kun Yoo Ko, Kyungki-do (KR); Hyun Wook Shim, Kyungki-do (KR); Bong Il Yi, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/319,343

(22) Filed: Dec. 28, 2005

(65) Prior Publication Data

US 2006/0231854 A1 Oct. 19, 2006

(30) Foreign Application Priority Data

Apr. 15, 2005 (KR) ............... 10-2005-0031682

(51) Int. Cl.
*H01L 29/22* (2006.01)
*H01L 33/00* (2006.01)

(52) U.S. Cl. .......... 257/99; 257/103; 257/704; 257/705; 257/E33.062; 257/E33.064; 257/E33.066

(58) Field of Classification Search .............. None
See application file for complete search history.

(56) References Cited

U.S. PATENT DOCUMENTS

| 5,563,422 | A | 10/1996 | Nakamura et al. |
|---|---|---|---|
| 6,614,172 | B2 | 9/2003 | Chiu et al. |
| 6,791,116 | B2 | 9/2004 | Takahashi et al. |
| 6,812,502 | B1 | 11/2004 | Chien et al. |
| 6,869,820 | B2 | 3/2005 | Chen |
| 2003/0143772 | A1 | 7/2003 | Chen |
| 2005/0077537 | A1 | 4/2005 | Seong et al. |
| 2005/0212002 | A1* | 9/2005 | Sanga et al. ............ 257/96 |
| 2005/0279990 | A1* | 12/2005 | Liu et al. ............ 257/13 |
| 2006/0054907 | A1* | 3/2006 | Lai ............ 257/96 |
| 2006/0220057 | A1* | 10/2006 | Shim et al. ............ 257/103 |

FOREIGN PATENT DOCUMENTS

| DE | 102 11 531 A1 | 10/2003 |
| EP | 1 523 047 A2 | 4/2005 |
| JP | 2000183400 | 6/2000 |
| KR | 2005-34155 | 6/2006 |
| WO | WO 2004086522 A1 * | 10/2004 |
| WO | WO 2006/006822 | 1/2006 |

* cited by examiner

*Primary Examiner*—Minhloan Tran
*Assistant Examiner*—Leslie Pilar Cruz
(74) *Attorney, Agent, or Firm*—Volpe and Koenig P.C.

(57) ABSTRACT

The present invention relates to a flip chip type nitride semiconductor light emitting device having p-type and n-type nitride semiconductor layers, and an active layer in between. The invention also has an ohmic contact layer formed on the p-type nitride semiconductor layer, a light-transmitting conductive oxide layer formed on the ohmic contact layer, and a highly reflective metal layer formed on the light-transmitting conductive oxide layer.

14 Claims, 5 Drawing Sheets

(a)

(b)

FLIP CHIP TYPE NITRIDE SEMICONDUCTOR LIGHT EMITTING DEVICE

CLAIM OF PRIORITY

This application claims the benefit of Korean Patent Application No. 2005-31682 filed on Apr. 15, 2005, in the Korean Intellectual Property Office, the disclosure of which is incorporated herein by reference.

BACKGROUND OF THE INVENTION

1. Field of the Invention

The present invention relates to a nitride semiconductor light emitting device, and more particularly, to a flip chip type nitride semiconductor light emitting device having a highly reflective ohmic contact structure which can reduce unfavorable effect of reflective metal used while enhancing reflectivity.

2. Description of the Related Art

In general, a nitride semiconductor constituting a nitride semiconductor light emitting device, more particularly, a p-type nitride semiconductor layer has a wide band gap, having a difficulty in forming an ohmic contact with an electrode. Also, an ohmic contact structure adopted in a flip chip type nitride semiconductor light emitting device is required to have high reflection property for enhancement of luminance in addition to its basic ohmic contact function.

In general, metals such as Ag and Al are mainly used for highly reflective metal. However, migration tendency of Ag has an effect on GaN dislocation, presenting a problem of possible current leakage. Al is stable but has difficulty in forming an ohmic contact. Therefore, an additional layer is needed to form an ohmic contact with the p-type nitride semiconductor.

U.S. Pat. No. 5,563,422 (patented on Oct. 8, 1996 and assigned to Nichia Chemistry Co.) proposes a transparent electrode structure which comprises a thin Ni/Au film deposited on a p-type nitride semiconductor layer, which is thermally treated so that an ohmic contact is possible. However, the transmission ratio of the transparent electrode is low at 60% to 70%, undermining light emission efficiency overall.

On the other hand, Japanese Laid-Open Publication Application No. 2000-183400 (published on Jun. 30, 2000 by Toyoda Gosei Co. LTD.) proposes a method of adopting a thin film made of Ni or Co and a reflective metal layer composed of Ag, Rh, and Pt. The application discloses a multi-level structure in which the thin film is used to form an ohmic contact, and a metal layer having high reflectivity is additionally deposited to allow high reflectivity. But, Ni or Co is metal, and does not have high transmission ratio even if it is made into a thin film, which does not allow a great level of improvement in luminance.

Therefore, a new reflective ohmic contact structure has been required in the art in order to stably prevent unfavorable effects of the reflective metal layer while maximizing the reflective effect from the reflective metal layer to improve luminance in a flip chip type nitride semiconductor light emitting device.

SUMMARY OF THE INVENTION

The present invention has been made to solve the foregoing problems of the prior art and it is therefore an object of the present invention to provide a nitride light emitting device in which a light-transmitting conductive oxide layer is adopted to maximize reflection effect of a reflective ohmic contact structure, thereby allowing high light-emission luminance.

According to an aspect of the invention for realizing the object, there is provided a flip chip type nitride semiconductor light emitting device including: p-type and n-type semiconductor layers; an active layer formed between the p-type and n-type semiconductor layers; an ohmic contact layer formed on the p-type nitride semiconductor layer; a light-transmitting conductive oxide layer formed on the ohmic contact layer; and a highly reflective metal layer formed on the light-transmitting conductive oxide layer.

Preferably, the ohmic contact layer comprises an $In_2O_3$ layer containing at least one selected from a group including Cu, Zn, and Mg.

In this case, it is preferable that the ohmic contact layer has a thickness of about 5 to 500 Å.

On the other hand, the ohmic contact layer may be made of alloy selected from a group including MnNi, $LaNi_5$, ZnNi, MgNi, and ZnMg. In addition, the ohmic contact layer is made of at least one selected from a group including Rh, Ru, Pt, Pd, Ir, Ni, Co and alloys thereof. It is preferable that the ohmic contact layer composed of above metal or alloy has a thickness of about 5 to 500 Å.

The light-transmitting conductive oxide layer may comprise an oxide layer which has current dispersion effect and has high light transmission ratio and a certain level of refraction index. Preferably, the light-transmitting conductive oxide layer is composed of at least one selected from a group including Indium Tin Oxide (ITO), ZnO, and MgO. It is preferable that the light-transmitting conductive oxide layer has a thickness of about 0.1 to 1 μm.

Preferably, the highly reflective metal layer is made of at least one selected from a group including Al, Ag, Rh, Ru, Pt, Pd and alloys thereof. For sufficient reflection effect, it is preferable that the highly reflective metal layer has a thickness of at least 0.1 μm.

In a preferred embodiment of the present invention, the ohmic contact layer is an $In_2O_3$ layer containing Cu, and the light-transmitting conductive oxide layer is an ITO layer. In this case, the highly reflective metal layer is made of Al, which has relatively high reflectivity for short-wavelength light.

In a particular embodiment of the present invention, the flip chip type nitride semiconductor light emitting device may further include a diffusion prevention layer between the light-transmitting conductive oxide layer and the highly reflective metal layer. The diffusion prevention layer may comprise of a material selected from a group consisting of Cu, Mo, V, W and alloy thereof and the alloy may include Ti—W. Particularly, in case of using metal such as Al for the reflective metal layer, it may diffuse during thermal treatment, undermining the characteristics of the conductive oxide layer. It is preferable that the diffusion prevention layer has a thickness of about 10 to 10000 Å.

In another embodiment of the present invention, the flip chip type nitride semiconductor light emitting device may further include a bumping buffer layer made of W or alloy thereof on the highly reflective metal layer. The bumping buffer layer can protect the reflective ohmic contact structure by buffering the impact from die-bonding.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
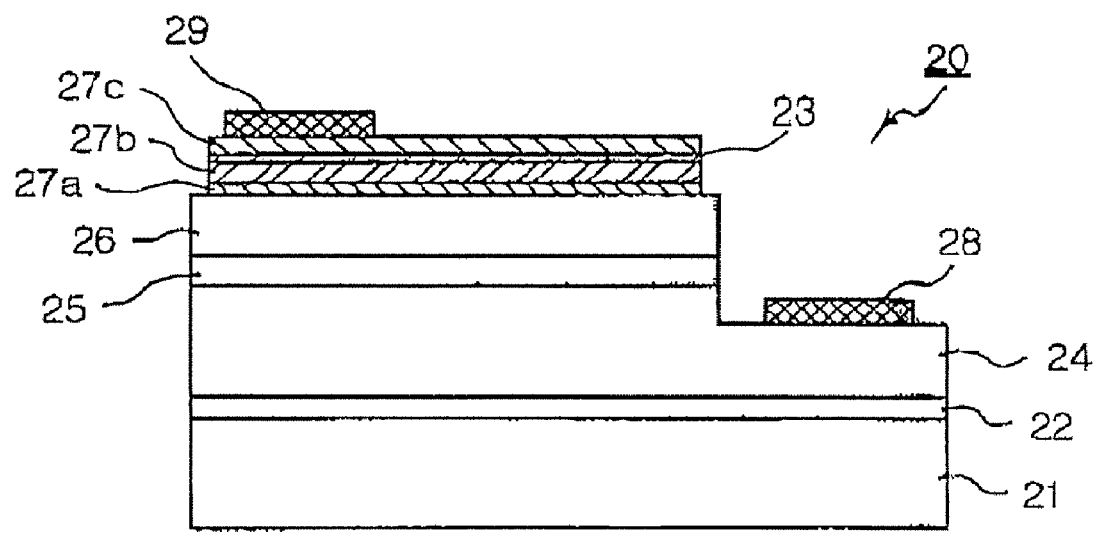
FIG. 1 is a sectional view illustrating a flip chip nitride semiconductor light emitting device according to an embodiment of the present invention.

FIG. 1 is a sectional view illustrating a flip chip type nitride semiconductor light emitting device according to an embodiment of the present invention.

As shown in FIG. 1, the flip chip type nitride light emitting device 20 includes an n-type nitride semiconductor layer 24, an active area 25, and a p-type nitride semiconductor layer 26 formed in their order on a substrate having a buffer layer 20. The substrate 21 is a light-transmitting substrate which may be a heterogeneous substrate like a sapphire substrate or a homogeneous substrate like a GaN substrate. The exposed upper surface of the n-type nitride semiconductor layer 24 is joined with an n-electrode 28, and the p-type nitride semiconductor layer 26 is joined with a p-electrode 29 through a reflective ohmic contact structure.

The reflective ohmic contact structure adopted in this embodiment includes an ohmic contact layer 27a, a light-transmitting conductive oxide layer 27b, and highly reflective metal layer 27c formed in their order on the p-type nitride semiconductor layer 26.

The ohmic contact layer 27a may be made of metal, alloy or conductive oxide layer selected to form an ohmic contact with the p-type nitride semiconductor layer 26. Preferably, the ohmic contact layer 27a may comprise an $In_2O_3$ layer containing one selected from a group including Cu, Zn, and Mg. The Indium oxide is useful in that it has relatively high light transmission ratio to form an ohmic contact. It is preferable that the Indium oxide-based ohmic contact layer has a thickness of about 5 to 500 Å.

The ohmic contact layer 27a usable in the present invention is not limited to the above, and it may use alloy selected from a group including MnNi, $LaNi_5$, ZnNi, MgNi, and ZnMg or may use metal or alloy selected from a group including Rh, Ru, Pt, Pd, Ir, Ni, Co, and alloys thereof. It is preferable that the ohmic contact layer composed of such metal or alloy has a thickness of about 5 to 500 Å. In case of using metal or alloy for the ohmic contact layer, thermal treatment is needed for enhancing light transmission ratio of the ohmic contact layer.

In addition, the light-transmitting conductive oxide layer 27b may comprise an oxide layer having high light transmission ratio and a certain level of refraction index, and preferably, may be composed of at least one selected from a group including Indium Tin Oxide (ITO), ZnO, and MgO. For example, ITO has high transmission ratio of about 96% as well as a certain level of refraction index, which make it possible to enhance reflection effect of the highly reflective metal layer 27c according to the principle of admittance. The resultant enhancement effect of reflectivity will be explained hereunder in detail with reference to FIG. 3.

Particularly, forming the light-transmitting conductive oxide layer 27b in an appropriate thickness can effectively reduce the occurrence of current leakage due to use of metal such as Ag, having migration tendency, for the highly reflective metal layer 27c. In consideration of such aspect, it is preferable that the light-transmitting conductive oxide layer 27b has a thickness of about 0.1 to 1 μm. In addition, since the light-transmitting conductive oxide layer 27b has relatively high resistance, enhanced current spreading effect can be expected.

The highly reflective metal layer 27c may be composed of one selected from a group including Al, Ag, Rh, Ru, Pt, Pd, and alloys thereof. As described above, the highly reflective metal layer 27c combined with the light-transmitting conductive oxide layer 27b such as an ITO layer can greatly enhance reflection efficiency. For sufficient reflection effect, it is preferable that the highly reflective metal layer 27c has a thickness of at least 0.1 μm.

The reflective ohmic contact structure adopted in the present invention may be modified into diverse forms. For example, in case of using metal such as Al, having high diffusion rate, for the highly reflective metal layer, a diffusion prevention layer may be additionally provided so that the characteristics of the light-transmitting conductive oxide layer is not undermined by undesired diffusion. The diffusion prevention layer may be composed of a material selected from a group consisting of Cu, Mo, V, W and alloy thereof and the alloy may include Ti—W. Preferably, the diffusion prevention layer has a thickness of about 10 to 10000 Å.

Figure 2:
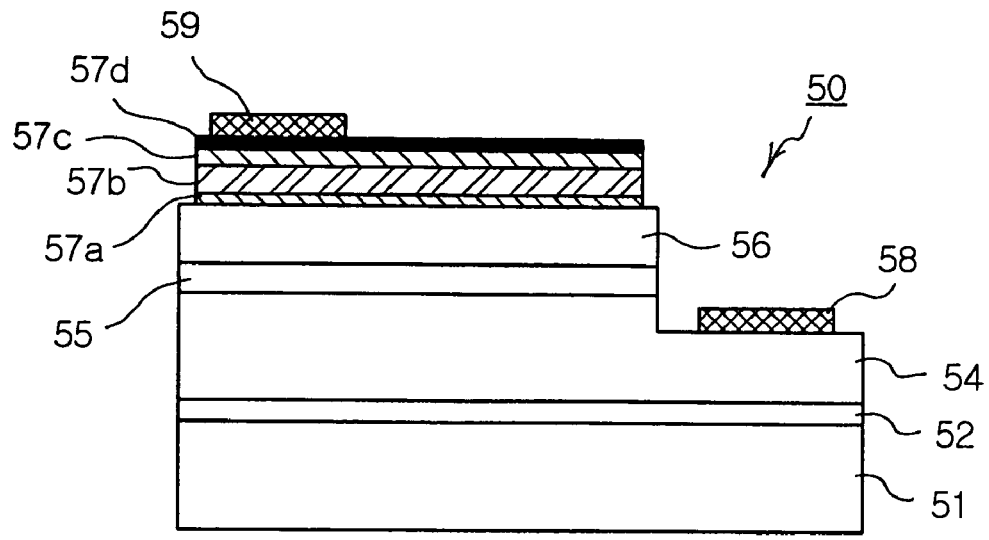
FIG. 2a is a sectional view illustrating the flip chip nitride semiconductor light emitting device according to another embodiment of the present invention.
FIG. 2b illustrates the light emitting device shown in FIG. 2a die-bonded onto the package substrate.
Figure 2:
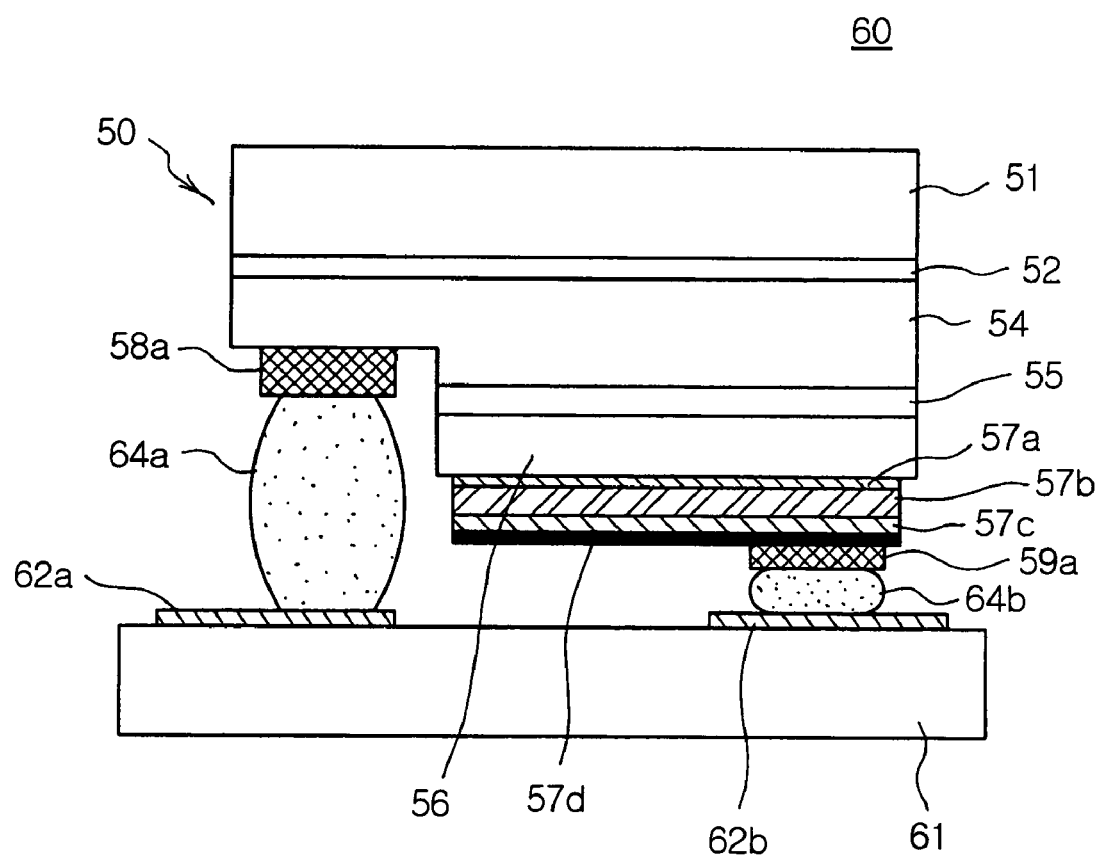

In addition, as shown in FIG. 2a, a bumping buffer layer 57d may be additionally provided to reduce an impact from die-bonding the flip chip type nitride light emitting device 50 to the package substrate 61. FIG. 2a is a sectional view illustrating the flip chip type nitride semiconductor light emitting device according to another embodiment of the present invention.

In case of using metal such as Al, having high diffusion rate, for the highly reflective metal layer, a diffusion prevention layer may be additionally provided so that the characteristics of the light-transmitting conductive oxide layer is not undermined by undesired diffusion. The diffusion prevention layer 23 may be composed of a material selected from a group consisting of Cu, Mo, V, W and alloy thereof and the alloy may include Ti—W. Preferably, the diffusion prevention layer 23 has a thickness of about 10 to 10000 Å.

The reflective ohmic contact structure adopted in this embodiment includes an ohmic contact layer 57a, a light-transmitting conductive oxide layer 57b, and a highly reflective metal layer 57c formed in their order on the p-type nitride semiconductor layer 56, similar to the reflective ohmic contact structure shown in FIG. 1. In this embodiment, the bumping buffer layer 57d is additionally formed between the highly reflective metal layer 57c and the p-bonding pad 59. The bumping buffer layer 57d is used as means to buffer the impact from the p-bonding pad during the die bonding, and preferably, made of W or alloy of W such as W—Ti.

FIG. 2b illustrates an example in which the nitride light emitting device shown in FIG. 2a is flip-chip bonded to the package substrate. In FIG. 2b, the package substrate 61 and the flip chip light emitting device package 60 having the nitride semiconductor light emitting device 50 flip-chip bonded thereon are illustrated. The n-electrode and the p-bonding pad 58 and 59 join the conductor patterns 62a and 62b on the package substrate 61 via solders 64a and 64b.

There may be an impact from die bonding procedure for fabricating the flip chip package, and the bumping buffer layer 57d can protect the reflective ohmic contact structure from the impact. The bumping buffer layer 57d is made of W having relatively high heat conductivity or alloy thereof, and thus may function as a heat sink. A metal layer having relatively low heat conductivity such as Al can be more useful.

In addition, in this flip chip light emitting device package, the light-transmitting conductive oxide layer and the highly reflective metal layer can have much higher reflectivity than the reflectivity of the highly reflective metal layer itself. The luminance of the light emitting device can be greatly improved through such high reflectivity.

Figure 3:
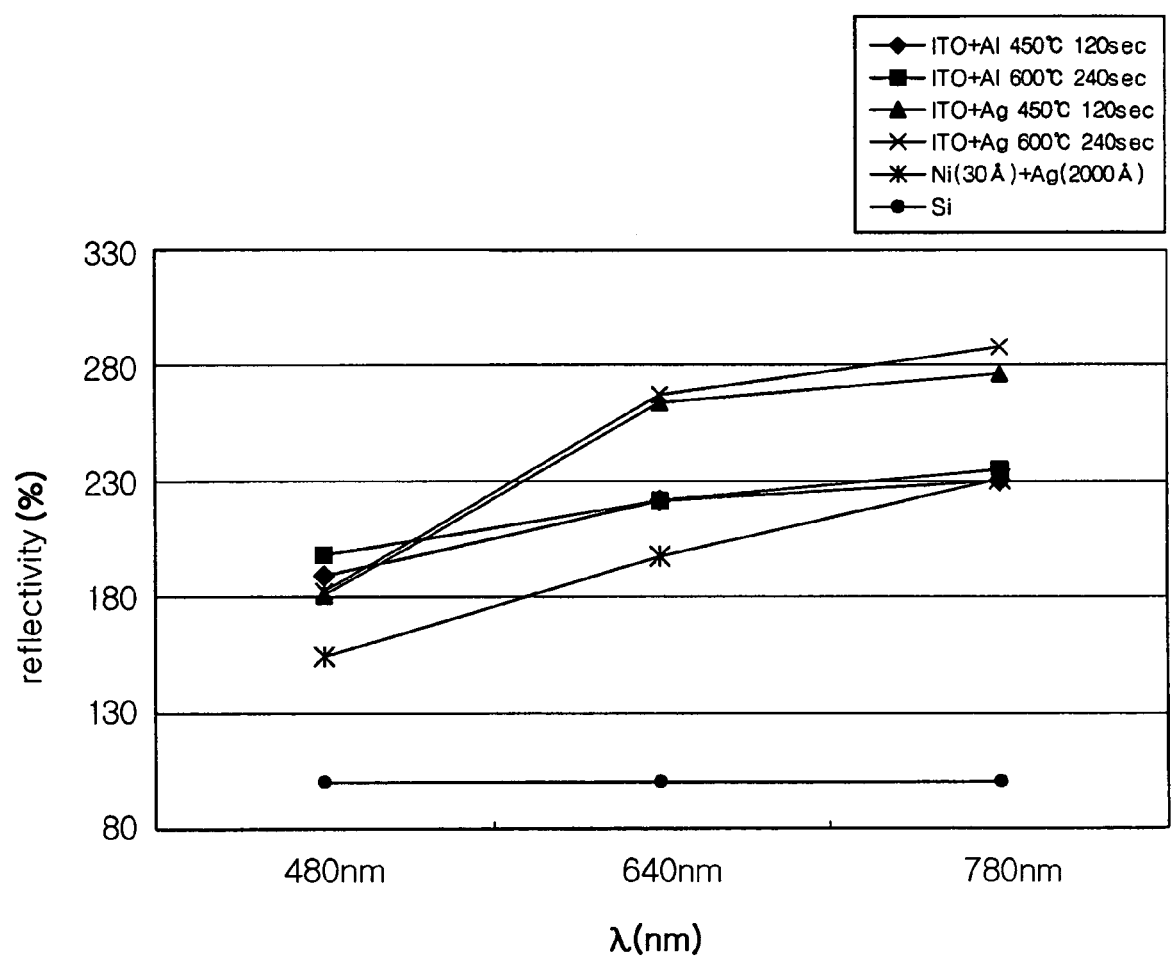
FIG. 3 is a graph showing reflectivity of each wavelength range to explain the improvement of reflection effect due to adoption of light-transmitting conductive oxide layer.

FIG. 3 is a graph showing reflectivity of each wavelength range in order to explain the enhanced reflection effect. The reflectivity here is a relative value defined for the convenience of explanation. The reflectivity shown here are values relative to the reflectivity of silicon set 100%.

In order to confirm the fact that combining the light-transmitting conductive oxide layer with the highly reflective metal according to the present invention allows higher reflectivity than the reflectivity of the metal itself, the reflectivity of a reflective structure of the invention produced by combining an ITO layer (3800 Å), an Al layer (2000 Å) or an ITO layer (3800 Å) and an Ag layer (2000 Å), and the reflectivity of a conventional reflection structure produced by combining an Ni layer (30 Å) and an Ag layer (2000 Å) were measured, respectively. In addition, the reflection structure of the present invention were thermally treated at temperatures, 450° C. and 600° C., and the results are shown in FIG. 3.

There are some variations depending on the thermal treatment temperature, but on average, the combination of an ITO layer with an Al or Ag layer exhibits the reflectivity improved by 15 to 60%, compared with the combination of an Ni layer with an Ag layer. This can be understood that the ITO having high transmission ratio of 93% and a certain level of refraction index, increases the reflection effect of the reflective metal layer according to the principle of admittance.

Particularly, at 480 nm, which is the light wavelength of the short-wavelength nitride light emitting device, the ITO layer/Al layer shows higher reflectivity than the ITO layer/Ag layer. Therefore, in case of using a short-wavelength light emitting device, Al can be more desirable for the highly reflective metal layer in terms of enhancement of reflectivity.

Figure 4:
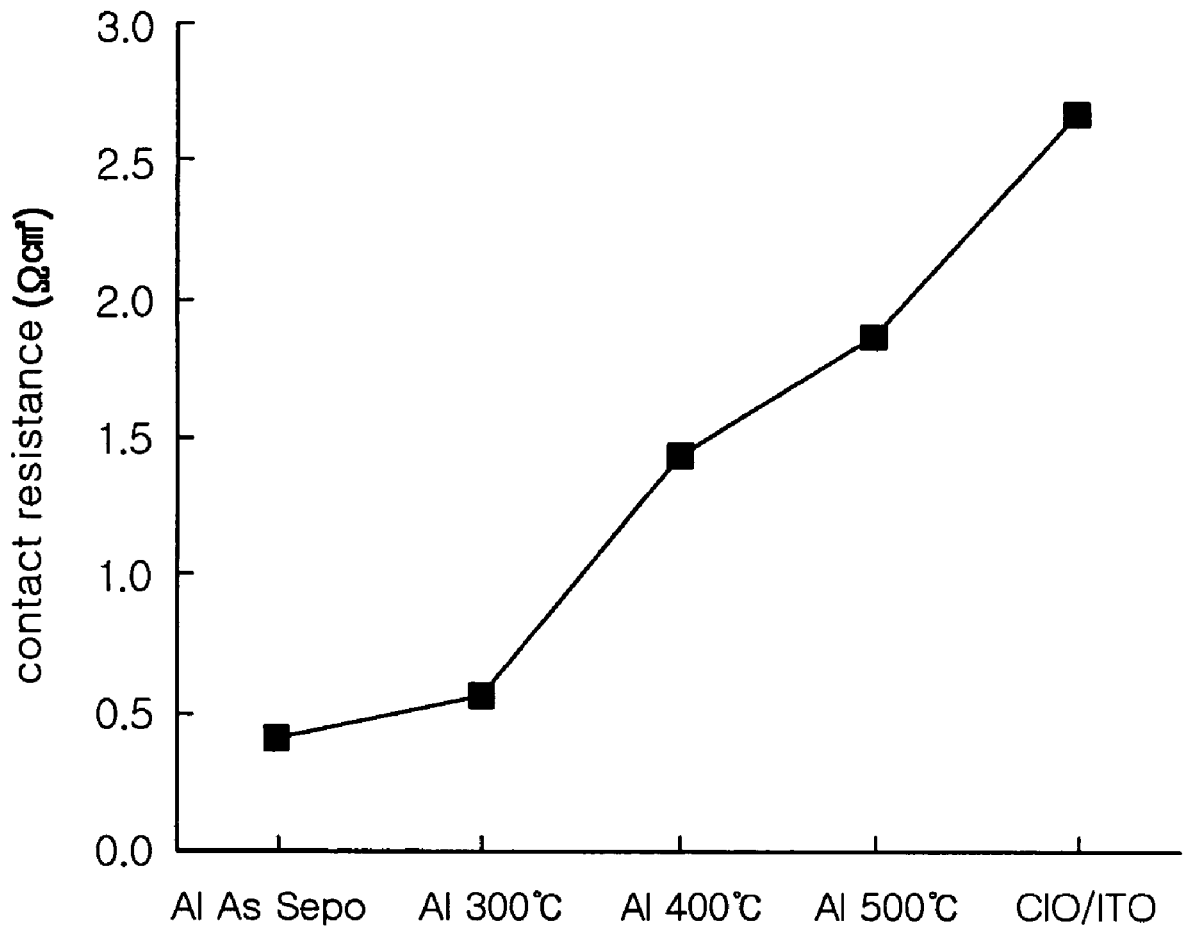
FIG. 4 is a graph showing contact resistance of the material of each layer that can be adopted in the present invention.

FIG. 4 is a graph showing contact resistance of material of each layer that can be adopted in the present invention. Contact resistance was measured from a first layered structure in which an $In_2O_3$ layer containing Cu used for the ohmic contact layer (referred to as "CIO" hereinafter) is combined with an ITO layer (3800 Å), a second layered structure in which the preferable highly reflective metal Al is directly deposited on the ITO layer of the first structure by sputtering, and several layered structures produced by thermally treating the second structure at different temperatures after deposition.

When only the CIO/ITO layer was formed, relatively high resistance of 2.7 $\Omega \cdot cm^2$ was observed, and the contact resistance of the Al layer increased in accordance with the increase in the thermal treatment temperature, but exhibited relatively low contact resistance overall. According to the experiment, Al layer allows relatively low contact resistance, and in order to obtain even lower contact resistance, it is preferable not to conduct thermal treatment, or conduct thermal treatment at a low temperature.

Figure 5:
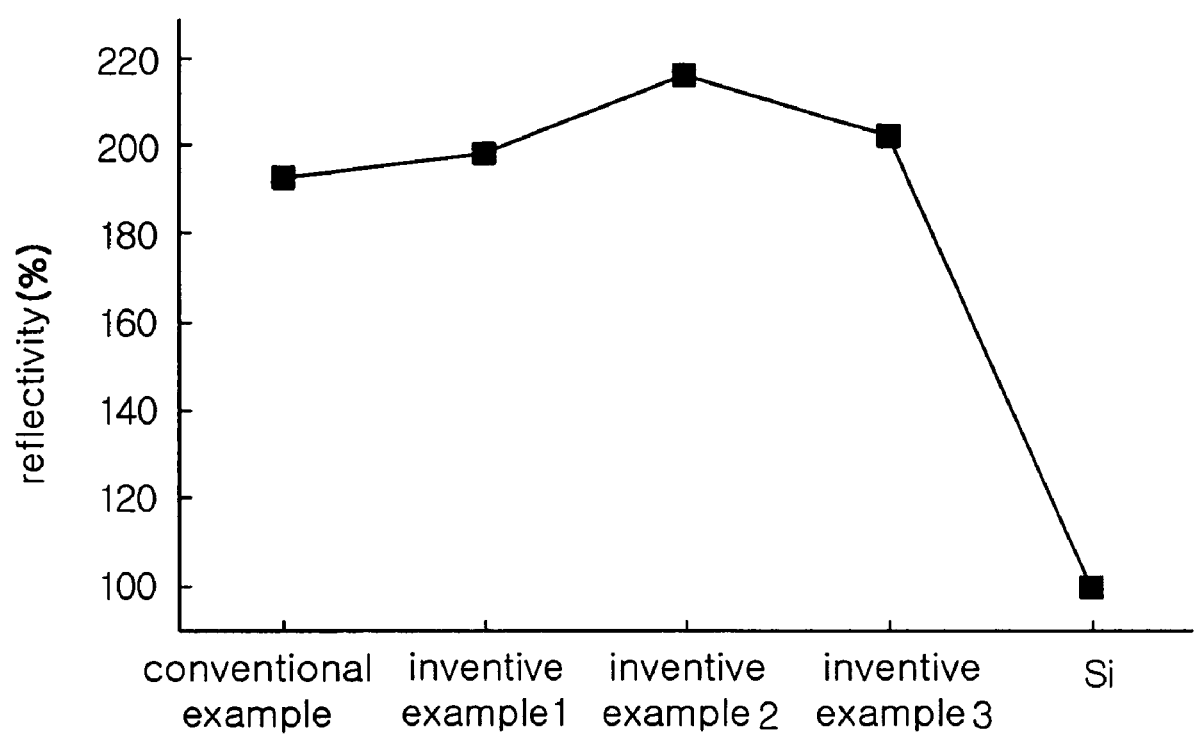
FIG. 5 is a graph comparing reflectivity of a conventional ohmic contact structure (a conventional example) with that of the reflective ohmic contact structure according to the present invention (inventive examples 1 to 3).

FIG. 5 is a graph comparing reflectivity of the conventional reflective ohmic structure (conventional example) and the reflective ohmic structure according to the present invention (inventive examples 1 to 3). Here, unlike the experiment conducted with reference to FIG. 3, the reflectivity was measured after the reflective ohmic contact structure was completed, thereby confirming the improved reflection effect (measured at 460 nm) of the reflective ohmic contact structure according to the present invention. The reflectivity used here was defined as the value relative to the actual reflectivity of silicon as in FIG. 3.

The conventional example used an Ni layer of 5 Å and an Ag layer of 2500 Å proposed in Japanese Laid-Open Patent Application No. 2000-183400. On the other hand, the inventive example 1 used a CIO layer of 50 Å, an ITO layer of 3800 Å, and an Ag/Pt layer of 2000 Å for the ohmic contact layer, the light-transmitting oxide layer, and the highly reflective metal layer, respectively.

In addition, the examples 3 and 4 used the same ohmic contact layer and the light-transmitting oxide layer as in the inventive example 1, except that an Al layer of 2000 Å was used for the highly reflective metal layer, and an additional Ti—W layer of 1000 Å as a bumping buffer layer was formed on the Al layer. In the inventive example 3, thermal treatment was omitted but in the inventive example 4, thermal treatment was conducted at about 400° C.

Then, the reflectivity at 480 nm of wavelength light for the conventional example and the inventive examples 1 to 3 were measured, and the results are shown in the graph in FIG. 5.

Referring to FIG. 5, the inventive examples 1 to 3 show about 15 to 25% of improvement in reflectivity compared with the reflectivity of the conventional example. Particularly, the inventive examples 2 and 3 using Al show greater improvements than the inventive example 1 using Ag, and the inventive example 2 with no thermal treatment on Al shows the most superior reflectivity.

Such high reflectivity is directly related to enhancement of the luminance, and therefore, the experiment confirms that the present invention enables fabrication of high quality flip chip type nitride light emitting devices having high luminance.

According to the present invention set forth above, optical admittance principle was used and the light transmission oxide layer having high transmission ratio and a certain level of refraction index is provided between the ohmic contact layer and the reflective metal layer to improve reflectivity, thereby obtaining a flip chip type semiconductor light emitting device having high luminance.

While the present invention has been shown and described in connection with the preferred embodiments, it will be apparent to those skilled in the art that modifications and variations can be made without departing from the spirit and scope of the invention as defined by the appended claims.

What is claimed is:

1. A flip chip type nitride semiconductor light emitting device comprising:
    p-type and n-type semiconductor layers;
    an active layer formed between the p-type and n-type semiconductor layers;
    an ohmic contact layer formed on the p-type nitride semiconductor layer;
    a light-transmitting conductive oxide layer formed on the ohmic contact layer;
    a highly reflective metal layer formed on the light-transmitting conductive oxide layer; and
    a diffusion prevention layer formed between the light-transmitting conductive oxide layer and the highly reflective metal layer,
    wherein the highly reflective metal layer is made of at least one selected from a group including Al, Ag and alloys thereof, and the diffusion prevention layer is made of a material selected from a group consisting of Cu, Mo, V, W and alloy thereof including Ti—W alloy.

2. The flip chip type nitride semiconductor light emitting device according to claim 1, wherein the ohmic contact layer comprises an $In_2O_3$ layer containing at least one selected from a group including Cu, Zn, and Mg.

3. The flip chip type nitride semiconductor light emitting device according to claim 2, wherein the ohmic contact layer has a thickness of about 5 to 500 Å.

4. The flip chip type nitride semiconductor light emitting device according to claim 1, wherein the ohmic contact layer is made of an alloy selected from a group including MnNi, $LaNi_5$, ZnNi, MgNi, and ZnMg.

5. The flip chip type nitride semiconductor light emitting device according to claim 4, wherein the ohmic contact layer has a thickness of about 5 to 500 Å.

6. The flip chip type nitride semiconductor light emitting device according to claim 1, wherein the ohmic contact layer is made of at least one selected from a group including Rh, Ru, Pt, Pd, Ir, Ni, Co and alloys thereof.

7. The flip chip type nitride semiconductor light emitting device according to claim 6 wherein the ohmic contact layer has a thickness of about 5 to 500 Å.

8. The flip chip type nitride semiconductor light emitting device according to claim 1, wherein the light-transmitting conductive oxide layer is composed of at least one selected from a group including Indium Tin Oxide (ITO), ZnO, and MgO.

9. The flip chip type nitride semiconductor light emitting device according to claim 8, wherein the light-transmitting conductive oxide layer has a thickness of about 0.1 to 1 µm.

10. The flip chip type nitride semiconductor light emitting device according to claim 1, wherein the ohmic contact layer comprises an $In_2O_3$ layer containing Cu, and the light-transmitting conductive oxide layer comprises an ITO layer.

11. The flip chip type nitride semiconductor light emitting device according to claim 10, wherein the highly reflective metal layer is made of Al.

12. The flip chip type nitride semiconductor light emitting device according to claim 1, wherein the highly reflective metal layer has a thickness of at least 0.1 µm.

13. The flip chip type nitride semiconductor light emitting device according to claim 1, wherein the diffusion prevention layer has a thickness of about 10 to 10000 Å.

14. The flip chip type nitride semiconductor light emitting device according to claim 1, further comprising a bumping buffer layer made of W or alloy thereof on the highly reflective metal layer.

* * * * *